(12) United States Patent
Loopstra et al.

(10) Patent No.: US 7,961,291 B2
(45) Date of Patent: Jun. 14, 2011

(54) LITHOGRAPHIC APPARATUS AND DEVICE MANUFACTURING METHOD (75) Inventors: Erik Roelof Loopstra, Heeze (NL); Bernardus Antonius Johannes Luttikhuis, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 734 days.

(21) Appl. No.: 11/316,359

(22) Filed: Dec. 23, 2005

(65) Prior Publication Data
US 2007/0146678 A1    Jun. 28, 2007

(51) Int. Cl.
G03B 27/42    (2006.01)
G03B 27/62    (2006.01)

(52) U.S. Cl. .................. 355/53; 355/75
(58) Field of Classification Search ............ 355/72, 355/75, 53; 414/935–941
See application file for complete search history.

(56) References Cited

U.S. PATENT DOCUMENTS

| | | | |
|---|---|---|---|
| 4,984,953 A * | 1/1991 | Nakazato et al. | 414/331.18 |
| 5,852,490 A * | 12/1998 | Matsuyama | 355/67 |
| 6,492,077 B1 | 12/2002 | Lin | |
| 6,549,277 B1 * | 4/2003 | Narushima et al. | 356/218 |
| 6,577,382 B2 * | 6/2003 | Kida et al. | 355/77 |
| 6,781,674 B1 | 8/2004 | Galburt et al. | |
| 6,829,038 B2 * | 12/2004 | Miwa | 355/53 |
| 2004/0075822 A1 * | 4/2004 | Hattori | 355/72 |
| 2004/0223132 A1 * | 11/2004 | Nishi et al. | 355/75 |
| 2004/0227925 A1 * | 11/2004 | Sato | 355/72 |
| 2005/0287821 A1 * | 12/2005 | Higashi et al. | 438/780 |
| 2006/0012771 A1 * | 1/2006 | Jeong | 355/75 |

FOREIGN PATENT DOCUMENTS

| | | |
|---|---|---|
| EP | 1 052 547 A2 | 11/2000 |
| EP | 1 052 547 A3 | 2/2002 |
| EP | 1 376 238 A2 | 1/2004 |
| JP | 6-310398 | 4/1994 |
| JP | 6-181166 | 6/1994 |
| JP | 10-239855 | 11/1998 |

OTHER PUBLICATIONS

Examination Report issued on Jan. 19, 2009 in Singapore Application No. 200608882-7.

* cited by examiner

*Primary Examiner* — Hung Henry Nguyen
*Assistant Examiner* — Steven H Whitesell-Gordon
(74) *Attorney, Agent, or Firm* — Pillsbury Winthrop Shaw Pittman LLP (57) ABSTRACT

A lithographic apparatus includes an illumination system to condition a radiation beam, a patterning device support to support a patterning device in a projection plane, the patterning device to pattern the radiation beam, a substrate table to hold a substrate, a projection system to project the patterned beam onto the substrate, and an exchange device to exchange an exchangeable object with an exchangeable object support that holds the exchangeable object during projection. The exchange device includes a load unit and an unload unit that each have a holding device to hold an exchangeable object. The holding devices are positioned substantially adjacent to each other and configured to hold an exchangeable object in a plane substantially parallel to the plane in which the exchangeable object is held in the exchangeable object support during projection. The exchangeable object support exchanges an exchangeable object with each of the holding devices.

22 Claims, 6 Drawing Sheets

LITHOGRAPHIC APPARATUS AND DEVICE MANUFACTURING METHOD

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus, a patterning device exchange device is used to exchange patterning devices between a stationary patterning device station, such as a loading station, inspection station, cleaning station or library and the patterning device support on which a patterning device is supported during projection of the pattern of that patterning device on a substrate. The known patterning device exchange device includes a robot having one loading position and a turret having two holding positions. The robot is configured to exchange a patterning device between a loading station and one of the holding positions of the turret and vice versa. The turret is configured to exchange a patterning device with the patterning device support. The time needed to exchange a patterning device on the patterning device support takes at least the time to lift the patterning device on the patterning device support out of the pod hole wherein it is supported during the projection phase so that the turret can take over the patterning device from the patterning device support. Thereafter the turret has to rotate over 180 degrees so that a new patterning device which was already present in the other holding position of the turret is brought in a position wherein it can be exchanged with the patterning device support. Then, the new patterning device is placed on the lifting pins of the patterning device support and lowered into the pod hole. When the patterning device is positioned in the pod hole the patterning device support can be moved back to a position above the lens column and the projection phase can begin.

The exchange of a patterning device in the known lithographic apparatus may take a considerably long time. This long exchange time is of direct influence on the throughput performance of the lithographic apparatus.

It has been proposed to use turrets having more than two holding positions in order to make a quicker exchange of patterning devices possible. Also, other embodiments of the patterning device exchange device have been proposed to decrease the time needed. However none of the alternative embodiments of the patterning device exchange device have been proven to substantially lower the exchange time needed to exchange a patterning device to a satisfactory level.

Furthermore, new projection techniques, such as stitching with four or more patterning devices or multiple (double) exposure, which require more different patterning devices of which the pattern has to be projected quickly after each other make the requirement of smaller exchange times of a patterning device even more important with respect to the increasing of the throughput performance of the lithographic apparatus.

SUMMARY

It is desirable to provide a lithographic apparatus and a device manufacturing method with which the exchange time needed to exchange a patterning device in the patterning device support may be substantially decreased.

According to an embodiment of the invention, there is provided a lithographic apparatus including: an illumination system configured to condition a radiation beam; a patterning device support configured to support a patterning device in a projection plane, the patterning device being capable of imparting the radiation beam with a pattern in its cross-section to form a patterned radiation beam; a substrate table configured to hold a substrate; and a projection system configured to project the patterned radiation beam onto a target portion of the substrate, wherein the lithographic apparatus includes an exchange device configured to exchange an exchangeable object with an exchangeable object support configured to hold the exchangeable object during the projecting of the patterned radiation beam, the exchange device including a load unit and an unload unit, each of the load unit and the unload unit having a holding device to hold an exchangeable object, the holding devices being positioned substantially adjacent to each other and being configured to hold an exchangeable object in a plane substantially parallel to the plane in which the exchangeable object is held in the exchangeable object support during the projecting of the patterned radiation beam, the exchangeable object support being capable of exchanging an exchangeable object with each of the holding devices.

According to an embodiment of the invention, there is provided a device manufacturing method including transferring a pattern from a patterning device onto a substrate, wherein an exchange device is used to exchange an exchangeable object, which exchangeable object is supported on a support during the transferring of the pattern in a projection phase, wherein during an exchange phase an exchangeable object is placed from the support in a holding position of an unload unit by moving said unload unit in a direction substantially perpendicular to the main plane of said exchangeable object, whereafter said support is positioned above a load unit which holds the exchangeable object to be loaded on said support, said load unit being positioned substantially adjacent to the unload unit, said load unit being moved towards the support in a direction substantially perpendicular to the main plane of the support to make exchange between the load unit and the support possible.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
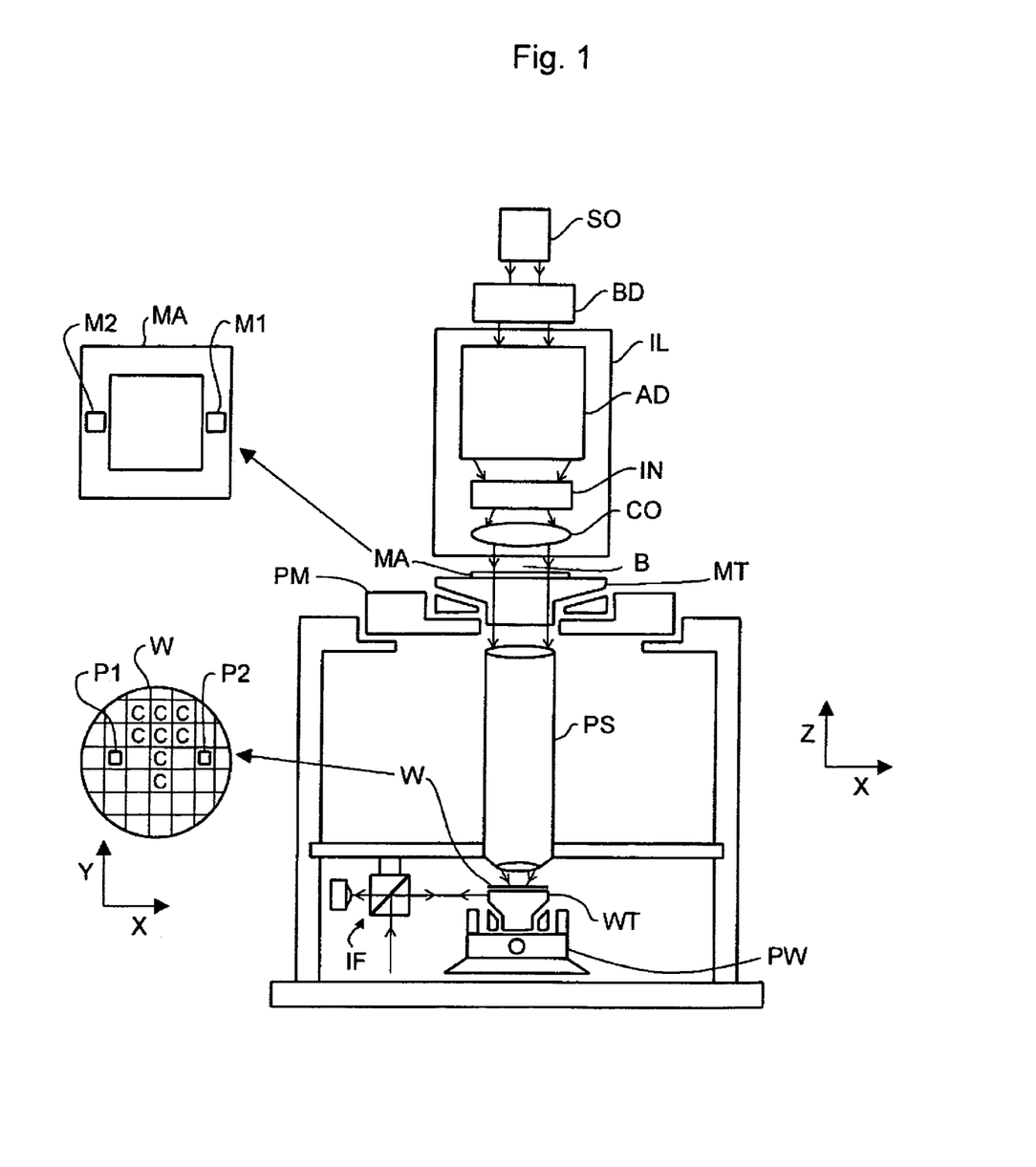
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
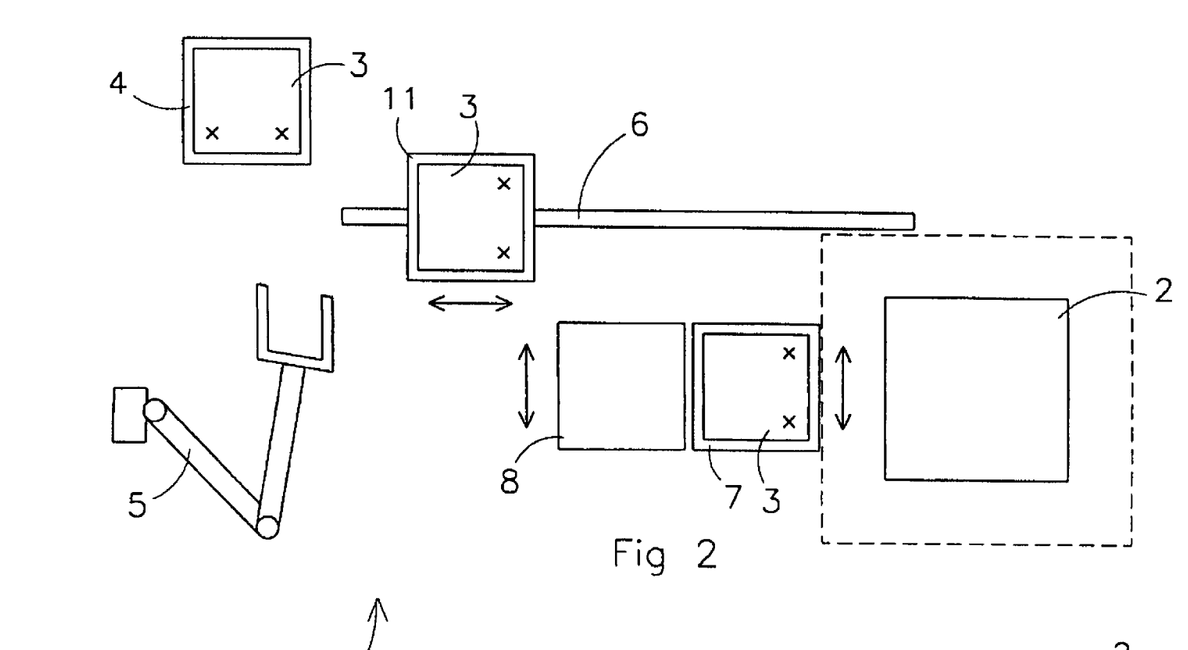
FIG. 2 depicts a top view of a patterning device exchange device according to a first embodiment of the invention.

FIG. 2 shows a patterning device exchange device according to an embodiment of the invention, which is in general indicated by the reference numeral 1. The patterning device exchange device 1 is configured to exchange patterning devices between a patterning device support 2 on which a patterning device is supported during the projection of the pattern of this patterning device, and one or more patterning device stations 4. These patterning device stations 4 include stations which are used to hold a patterning device, when it is not actually used in the projection process. Such patterning device stations 4 may for instance be a (stationary) loading station, a patterning device library, a patterning device inspection and/or cleaning station and/or any other stationary or semi-stationary station to hold patterning devices.

The patterning device exchange device 1 includes a robot 5, a linear transport unit 6, a load unit 7 and an unload unit 8. These parts of the patterning device exchange device are subsequently used to transfer a patterning device from a patterning device station 4 to the patterning device support 2 and from the patterning device support 2 back to the patterning device stations 4.

The robot 5 is configured to exchange a patterning device with the one or more patterning device stations 4 and with the linear transport device 6. This robot 5 may be any type of suitable manipulator to make such exchange of a patterning device between the loading station 4 and the linear transport device 6 possible. Such robots/manipulators are known to the man skilled in the art.

The linear transport device 6 is configured to exchange a patterning device 3 with the robot 5 and with the load unit 7 and the unload unit 8. In order to make such exchange possible the linear transport device 6 includes a carrier device 11 which can linearly be moved between a position where a patterning device 3 can be exchanged with the robot 5, a position where a patterning device 3 can be exchanged with the load unit 7 and a position wherein a patterning device can be exchanged with the unload unit 8. In the embodiment shown in FIG. 2, the linear transport device 6 is designed as a transport rail, whereby the carrier device is supported on this transport rail. However, any other suitable device to transport a patterning device along a linear line may be applied.

By using a linear transport device, the patterning device only moves along one linear line, which makes the use of relative simple motors and positioning measurement systems possible. The linear line along which the carrier device 11 may move is preferably a straight line, however this linear line may also have curves.

In order to make a proper positioning of the patterning device 3 with respect to the patterning support device 2 as well as the patterning device station 4, it may be desirable to rotate the patterning device about 180° C. For this reason, the robot 5 may be configured to rotate a patterning device. For instance, the clamping device of the robot 5 may be rotatable. However, in a preferred embodiment the linear transport device 6 is capable of rotating a patterning device. For this reason, the carrier device 11 may have two parts which are rotatable with respect to each other, the first part being supported on the support rail, and the second part being configured to carry the patterning device.

The load unit 7 is configured to exchange a patterning device 3 with the linear transport device 6 and the patterning device support 2. In order to make an exchange of a patterning device with the linear transport device 6 possible, the load unit 7 may be movable in a direction perpendicular to the transport direction of the linear transport device 6. In an alternative embodiment, the carrier device 11 of the linear transport device 6 may be movable in a direction towards the load unit 7. The unload unit 8 is in the transport direction of linear transport device 6 placed next to the load unit 7, so that also the unload unit 8 can exchange a patterning device with the linear transport device 6. To make an exchange between the linear transport device 6 and the unload unit 8 possible, the unload unit 8 may be movable in a direction perpendicular to the transport direction of the linear transport device 6, or the carrier device 11 of the linear transport device 6 may be movable in the direction towards the unload unit 8. Combined movement of the carrier device 11 and the unload unit 8 is also possible.

Figure 3:
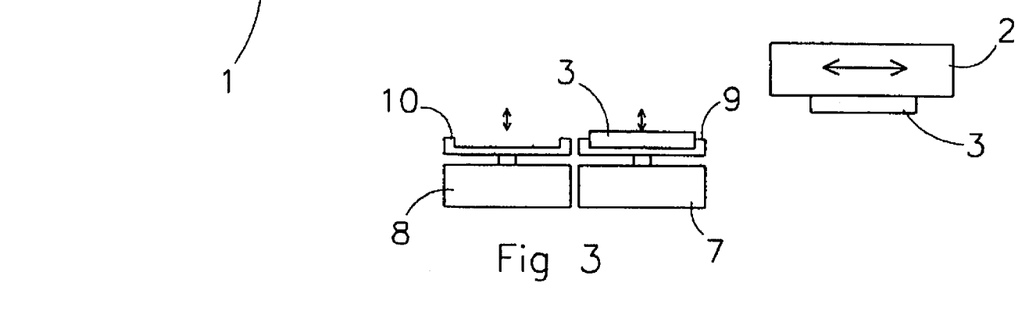
FIG. 3 depicts a side view of the embodiment of FIG. 2.

Each of the load unit 7 and the unload unit 8 includes a holding device 9 and 10, respectively (see FIG. 3). These holding devices 9, 10 are configured to hold a patterning device in substantially the same plane. The holding devices 9 and 10 are furthermore arranged adjacent to each other, so that when the load unit 7 and the unload unit 8 each hold a patterning device 3, these patterning devices are arranged at substantially adjacent locations. With adjacent is meant in this application, that the distance between the holding devices 9 and 10 is short, preferably as short as possible, so that during exchange the distance that has to be traveled to move from a unload position wherein a patterning device support device 2 can exchange a patterning device 3 with the unload unit 8 and a load position wherein the patterning device support 2 can exchange a patterning device with the load unit 7 is small, preferably as small as possible. This distance can in practice be for instance about 150-200 mm, but mainly depends on the dimension of the patterning device 3 in the direction of movement.

In the present embodiment the load unit 7 and unload unit 8 are separate units. However, in an alternative embodiment the load unit 7 and unload unit 8 may be combined in a single load/unload unit. Furthermore, in the present embodiment the load unit is dedicated to load patterning devices on the patterning device support 2 and the unload unit is dedicated to unload patterning devices from the patterning device support 2. However, it is possible that the load unit is used to unload a patterning device from the patterning device support 2, while the unload unit 8 is used to load a patterning device on the patterning device support. Thus, although for clarity reasons the terms load unit and unload unit are used in the present application, the load unit 7 and load unit 8 may both be regarded as load/unload units.

The arrangement of the holding device 9 and the holding device 10 is shown more clearly in FIG. 3. In this figure, the load unit 7 holds a patterning device 3 which is to be loaded on the patterning device support 2 after that the projection phase of the pattern of the patterning device 3 which is supported in the patterning device support 2 has finished. However, before the patterning device 3 on the load unit 7 can be loaded on the patterning device support 2, the patterning device 3 supported on the patterning device support 2 has to be unloaded on the unload unit 8. Now the steps to exchange the patterning device 3 on the patterning device support with the patterning device 3 on the load unit 7 will be explained for an embodiment.

Once the projection phase is completed, the patterning device support 2 is moved to a position above the unload unit 8. Thereafter, the holding device 10 of the unload unit 8 will be moved upwards towards the patterning device support 2, so that the holding device 10 can take over the patterning device 3 from the patterning device support 2. Thereafter, the holding device 10 will move downwards again to make a movement over the patterning device support 2 towards the load unit 7 possible. When the patterning device support 2 is in a position above the load unit 7, the holding device 9 of the load unit 7 will be moved upwards to the patterning device support to load the patterning device 3 on the patterning device support 2. When the new patterning device 3 is loaded on the patterning device support 2, and subsequently the holding device 9 has moved downwards, the patterning device support 2 may be moved back to the projection area (indicated with dashed lines) where the projection phase with a new pattern can be started. Thereafter, the patterning device 3 on the unload unit 8 may be transferred to a patterning device station 4 via the linear transport device 6 and the robot 5. Also, a new patterning device 3 may be transferred to the load unit 8 so that a new patterning device 3 is ready to be loaded on the patterning device support after that the projection phase is finished.

In an alternative embodiment, the patterning device 3 may after being unloaded from the patterning device support 2 on the unload unit 8, be held on this unload unit 8, instead of being transferred back to the patterning device station 4. After a new projection phase, the patterning device 3 which is supported on the patterning device support 2 may be unloaded on the load unit 7, and subsequently the patterning device 3 on the unload station 8 may again be loaded on the patterning device support 2. In this way two patterning devices 3 may multiple times quickly be exchanged on the patterning device support 2.

As will be clear, the distance which the patterning device support 2 has to be moved from the holding device 10 to the holding device 9 is relatively small (substantially corresponds to the dimension of the patterning device 3). As a result, the time needed for this movement is also small. Since this movement makes part of the critical time path of the exchange, the total exchange time of a patterning device is decreased, and therewith the throughput of the total lithographic apparatus can be increased.

In the above exchange process the patterning device support 2 is moved from the position above the unload unit 8 to the position above the load unit 7. Since the patterning device support 2 is capable of moving with high velocities and with high accelerations, the patterning device support 2 is very suitable to make these movements. However, in an alternative embodiment, it is also possible that the patterning device support 2 remains in the same position, and that the load unit 7 and unload unit 8 move underneath the patterning device support 2 to bring the load unit 7 under the patterning device support 2 after that the patterning device has been unloaded on the unload unit 8. In such embodiment, it will however be desirable to provide motors with high velocity and high acceleration for the load unit 7 and unload unit 8 in order to obtain the same exchange times as the embodiments wherein the patterning device support 2 is moved. Combination of movements of the patterning device support 2 and the load unit 7 and unload unit 8 are also possible.

In the above described exchange process, the holding devices 9 and 10 are moved in a vertical direction towards and away from the patterning device support 2 in order to make an exchange of a patterning device 3 possible. Such vertical movement is desirable in order to at one hand make an exchange of a patterning device possible, and at the other hand making a save movement of the patterning device support 2 with respect to load unit 7 and unload unit 8 in a direction substantially parallel to the plane of the patterning devices possible. The distance between the higher and the lower position is typically in practice about 1-5 mm, for instance about 2 mm. A patterning device 3, which is held in the higher position or in the lower position, is both regarded to be held in substantially the same plane as used in the present application.

In the above described embodiment, the holding device 9 and the holding device 10 are moved in vertical directions to make the exchange with the patterning device support 2 possible. However, it is also possible to move the patterning device support 2 in a vertical direction to make both the exchange of a patterning device and the safe movement in a direction substantially parallel to the patterning device possible. Also combined movements of the load unit 7 and the unload unit 8 and the patterning device support are possible.

In the embodiment of FIGS. 2 and 3, the patterning device 3 is held at the underside of the patterning device support 2. As a consequence, the load unit 7 and the unload unit 8 have to be positioned under the patterning device support 2 in order to make an exchange between the patterning device support 2 and the load unit 7 and the unload unit 8 possible. In alternative embodiments, the patterning device 3 may be held at the side or at the top of a patterning device support 2. It will be clear that in such case, the load unit 7 and the unload unit 8 will have to be placed opposite the side of the patterning device support 2 where the patterning device 3 is supported. For instance for the above described alternative embodiments at the side and above the patterning device support, respectively.

As is clear from FIG. 2, the load unit 7 is placed next to the projection area, and as already discussed above, the unload unit 8 is placed next to the load unit 7. As a result, the patterning device support 2 has to move over a minimal distance in order to reach the load unit 7 and the unload unit 8 for exchanging a patterning device 3 during an exchange phase. Since also these movements are part of the critical time path for a patterning device exchange, the time needed to move to and from the load unit 7 and unload unit 8 is relatively low.

Furthermore, the plane in which the holding devices 9 and 10 hold a patterning device substantially corresponds to the plane in which a patterning device is held during projection (i.e. the projection plane). In that way, the patterning device support 2 does not have to be moved in a vertical direction (other than the above described small movement to make exchange possible) or to be rotated when it is moved to the unload unit 8 and load unit 7 for the exchange of a patterning device 3. This makes a quick and efficient exchange of a patterning device 3 on a patterning device support 2 possible. In general the throughput of the lithographic apparatus is substantially increased since the time needed to exchange a patterning device 3 on the patterning device support 2 is decreased with the features as explained above.

It is remarked that the system shown in FIG. 2 and the other figures may also be used as an exchange system for the exchange of exchangeable parts of the projection system, such as lens pupil filters and/or lens elements. The exchange device 1 would be designed as shown in the Figures, whereby the patterning device 3 would be an exchangeable part of the projection system and the patterning device support 2 would be a support for holding the exchangeable part of the projection system. Furthermore, it is possible that the same exchange device 1 is used both for the exchange of patterning devices 3 and the exchange of exchangeable parts of the projection system.

Figure 4:
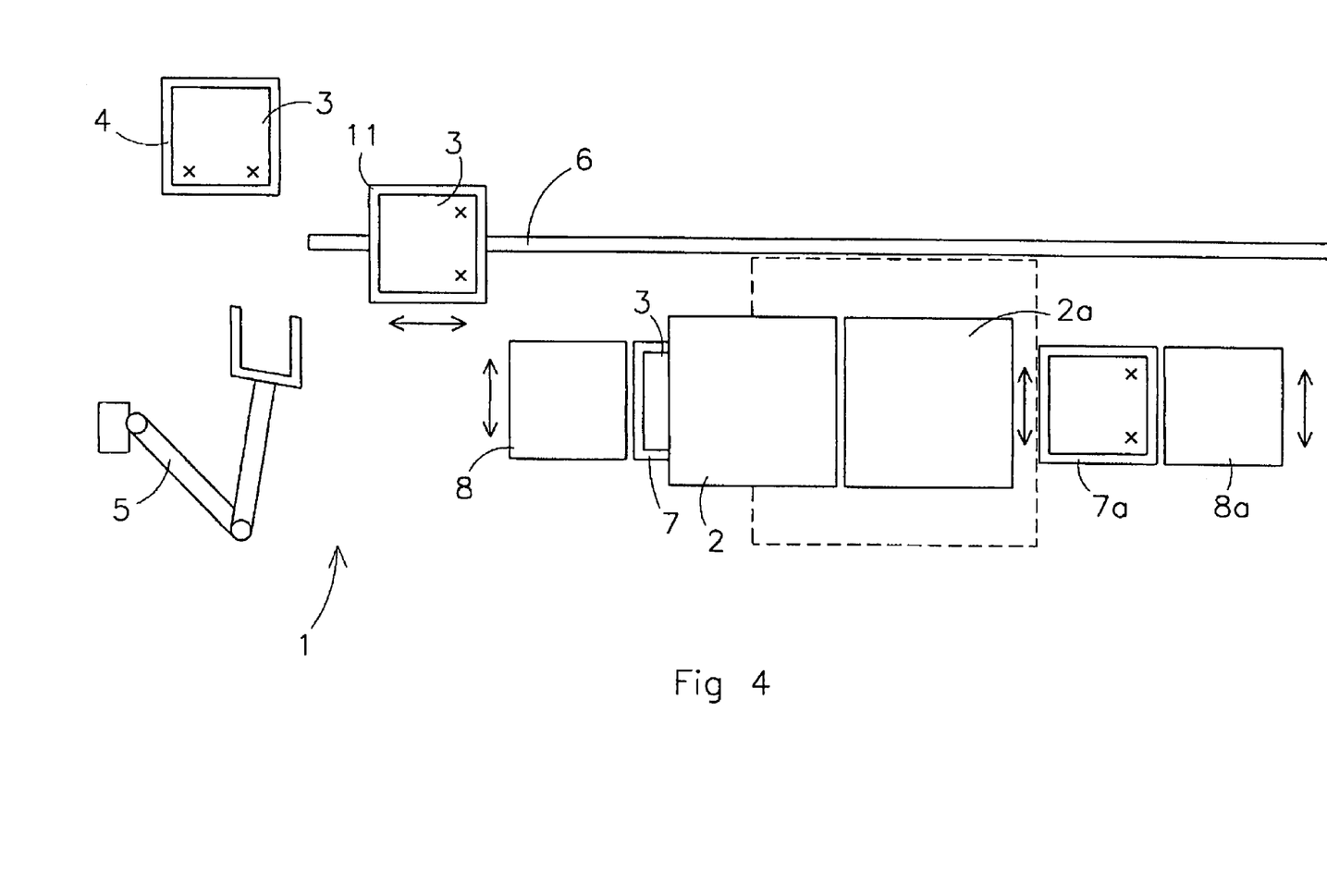
FIG. 4 depicts a top view of a patterning device exchange device according to a second embodiment of the invention.

FIG. 4 shows an alternative embodiment of a patterning device exchange 1 which in particular is suitable for lithographic apparatuses having two patterning device supports 2 and 2a. A lithographic apparatus having two (or more) patterning device supports is in particular suitable for projection processes wherein intensively use is made of different patterning devices, such as for instance double exposure, wherein a substrate is subsequently exposed to a pattern of two (or more) different patterning devices, or stitching. In order to make an efficient exchange of patterning devices 3 with both patterning device supports 2 and 2a possible, the patterning device exchange device 1 of FIG. 4 includes next to the parts herein above described with respect to FIGS. 2 and 3, a second load unit 7a and a second unload unit 8a. The second load unit 7a and the second unload unit 8a are configured to exchange a patterning device 3 with the linear transport device 6 and the second patterning device support 2a.

The second load unit 7a and the second unload unit 8a are arranged on the opposed side of the projection area (shown with dashed lines) with respect to the load unit 7 and the unload unit 8. In this way, both the exchange with the linear transport device 6 is possible as well as the shortest distance from the projection area to the load and unload units from the projection area is maintained for both the first and second patterning device supports 2 and 2a. In this way the movements which are time critical for the patterning device exchange process are kept small, preferably as small as possible, so that the time needed for these movements during an exchange of a patterning device is as small as possible.

The second load unit 7a and second unload unit 8a are positioned next to each other, so that the holding devices of the load and unload unit 7a and 8a are configured to hold a patterning device substantially adjacent and substantially in the same plane, preferably the projection plane. The loading and unloading of a patterning device on the patterning device support 2a can be executed as described herein above with respect to the embodiment of FIGS. 2 and 3, whereby the patterning device 3 is exchanged via the second load unit 7a and second unload unit 8a.

The linear transport device 6 includes in the present embodiment one carrier device 11. In an alternative embodiment it is possible to arrange two or more carrier devices on the linear transport device 6 in order to obtain further flexibility with respect to the exchange of patterning devices. Such flexibility may become of particular relevance in the event of double exposure or stitching jobs.

The presence of two patterning device supports 2, 2a makes in general two exchange concepts possible. In a first concept the patterning device on the second patterning device support 2a is exchanged when the pattern of the patterning device 3 on the first patterning device support 2 is projected on a substrate, and vice versa. In another concept, for instance during a double exposure job, the patterning devices in the first and second patterning device supports are exchanged substantially at the same time, so that after exchange of both patterning devices, both patterning devices can quickly after each other be used for the exposure of their patterns.

Figure 5:
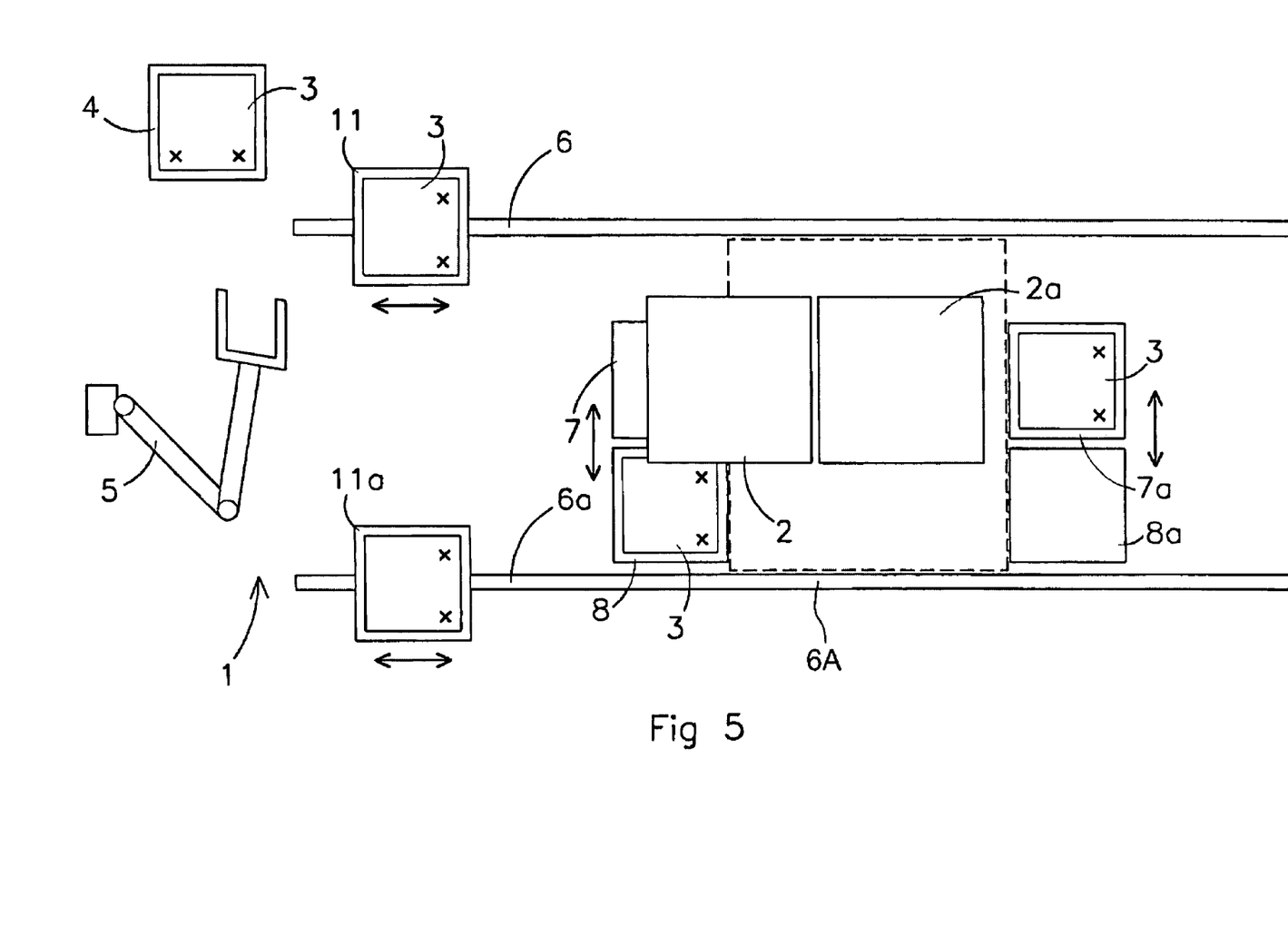
FIG. 5 depicts a top view of a patterning device exchange device according to a third embodiment of the invention.

In FIG. 5 another alternative embodiment of a patterning device exchange device 1 for the exchange of patterning devices 3 in a lithographic apparatus having two patterning device supports 2 and 2a is shown. In this embodiment the patterning device exchange device 1 includes a robot 5, a first and a second linear transport device 6 and 6a, a first and second load unit 7 and 7a, and a first and second unload unit 8 and 8a.

The robot 5 is configured to exchange patterning devices 3 with the patterning device station 4 and the first and second linear transport devices 6 and 6a. In a preferred embodiment, the first linear transport device 6 is used to transport patterning devices 3 to the load units 7 and 7a, while the second linear transport device 6a is used to transport patterning devices 3 from the unload units 8 and 8a to the patterning device station 4. In this way, a very practical and well-organized logistic system is obtained. However, as discussed before, the load and unload units may be used as unload and load units respectively, whereby also the functioning of the linear transport devices 6 and 6a may change.

The use of two linear transport devices 6 and 6a as arranged in FIG. 5 is beneficial because both the load unit 7, 7a and the unload unit 8, 8a can be directly located next to the projection area (shown in dashed lines) so that the distance to be traveled by a patterning device support 2, 2a in both directions is kept small, and also located next to a linear transport device 6, 6a, to make an exchange between the load and unload units and the linear transport device 6, 6a possible. Thus, with the second linear transport device 6a, the time needed to exchange a patterning device may be further decreased. The load units 7 and 7a and the unload units 8 and 8a may further be designed as described in relation to the embodiments of FIGS. 2, 3 and 4. As the holding devices of the load units 7, 7a and the unload units 8, 8a are configured to hold a patterning device adjacent to the respective load/unload unit and are held in substantially the same plane, preferably the projection plane, the time needed to unload and subsequently load a patterning device on the patterning device support 2 is substantially decreased compared to the known lithographic apparatus.

Figure 6:
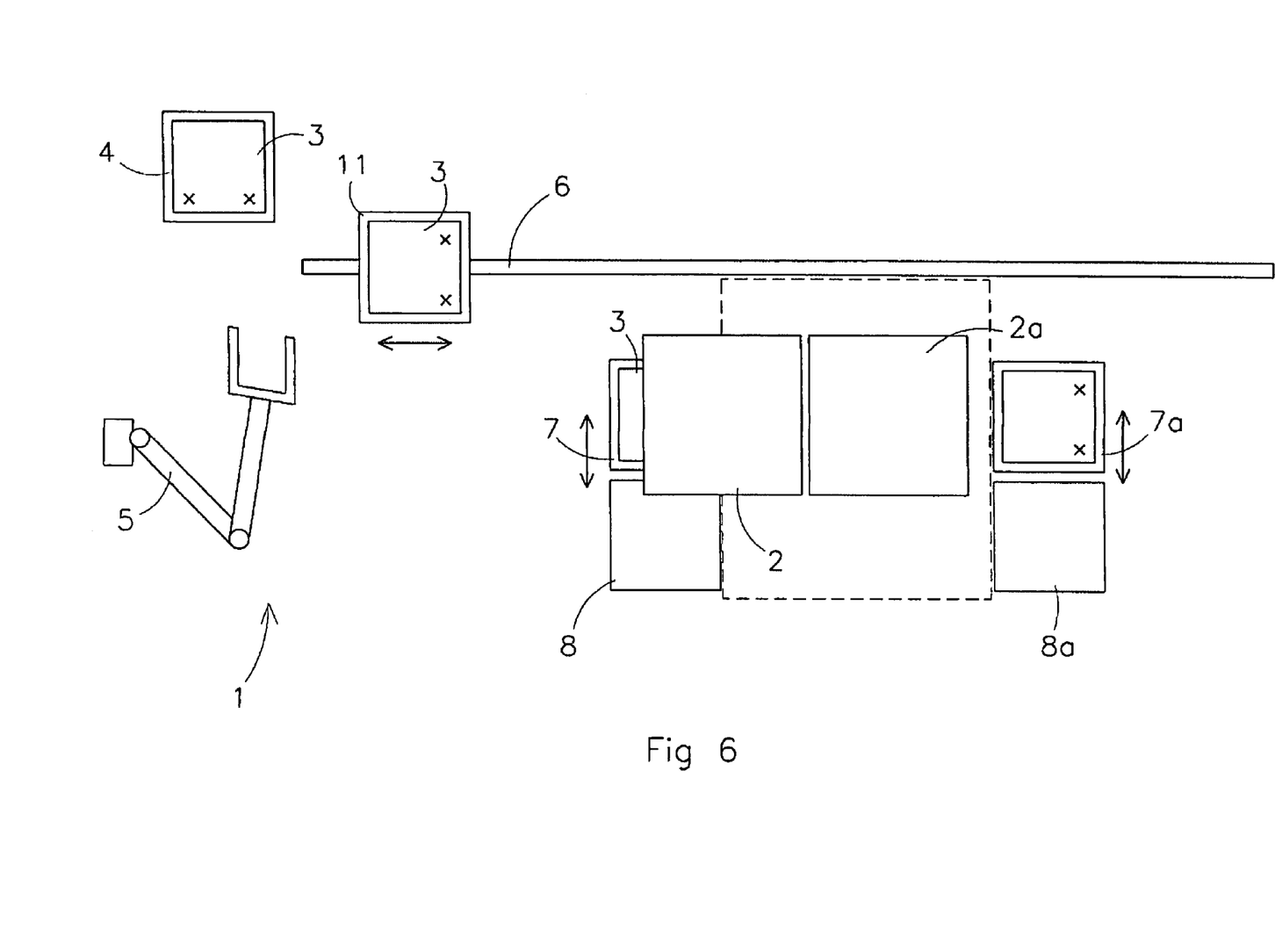
FIG. 6 depicts a top view of a patterning device exchange device according to a fourth embodiment of the invention.
Figure 7:
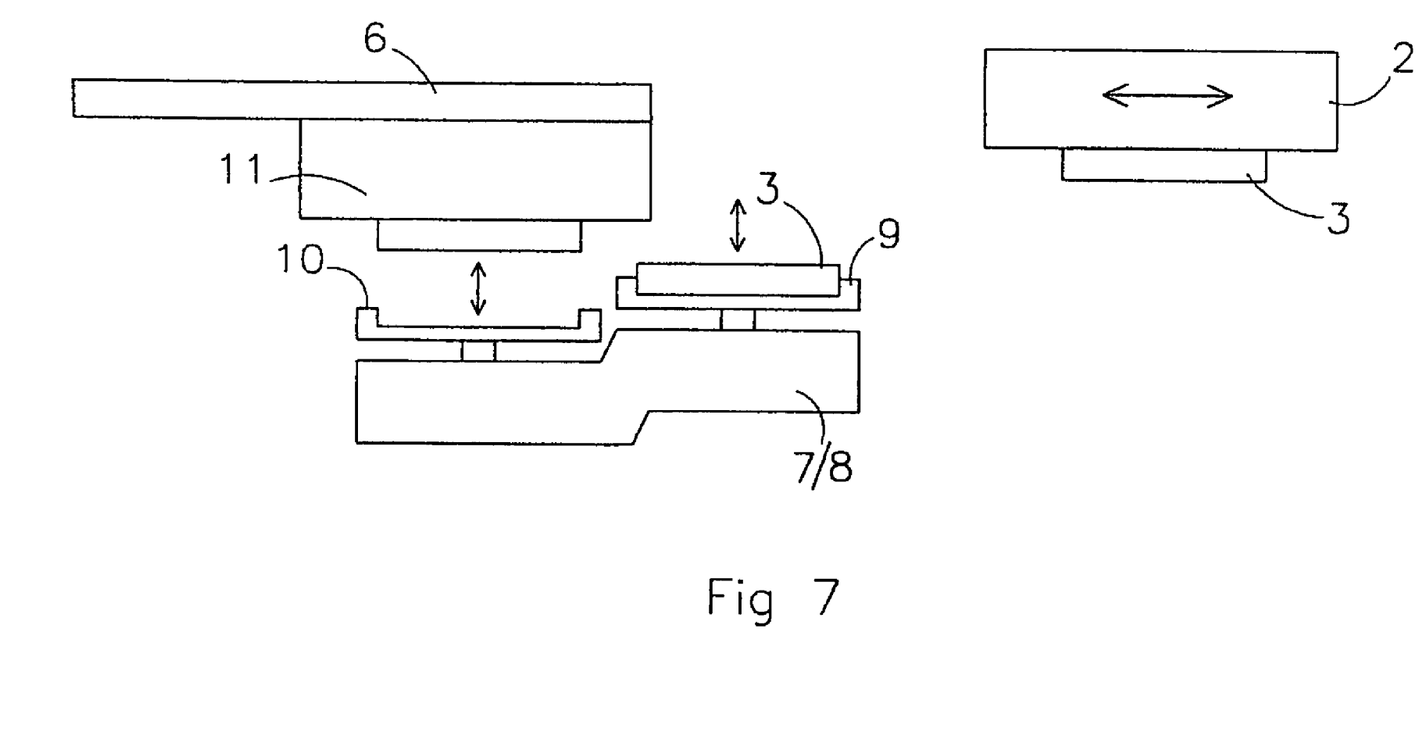
FIG. 7 depicts a side view of the embodiment of FIG. 6.

FIG. 6 describes another embodiment of an exchange device 1 for the exchange of patterning devices 3 in a lithographic apparatus having two patterning device supports 2 and 2a. In this embodiment the patterning device exchange device 1 includes a robot 5, a linear transport device 6, a first and second load unit 7 and 7a, and a first and second unload unit 8 and 8a. The first load unit 7 and the first unload unit 8 as well as the second load unit 7a and the second unload unit 8a are integrated as a single load/unload unit 7/8 and 7a/8a, respectively.

The robot 5 is configured to exchange patterning devices 3 with the patterning device station 4 and the linear transport device 6. Although the exchange device includes only one linear transport device 6, both the load unit 7, 7a and the unload unit 8, 8a are directly located next to the projection area (shown in dashed lines) so that the distance to be traveled by a patterning device support 2, 2a in both directions is kept small. To make exchange of a patterning device in a holding device of one of the load/unload units 7/8, 7a/8a with the respective patterning device support 2, 2a and the carrier device 11 possible, the load/unload units 7/8, 7a/8a are movable in a direction perpendicular to the transport direction of the transport device 6 between four positions which will be explained further in relation to FIG. 7.

Also in this embodiment, the time needed to unload and subsequently load a patterning device on the patterning device support 2 is substantially decreased compared to the known lithographic apparatus, since the holding devices of the load units 7, 7a and the unload units 8, 8a are configured to hold a patterning device adjacent to the respective load/unload unit. The load/unload units 7/8 and 7a/8a may further be designed as described in relation to the embodiments of FIGS. 2, 3 and 4.

FIG. 7 shows a side view of a part of the patterning device exchange device 1 of FIG. 6. It is clear that in this embodiment the load unit 7 and the unload unit 8 are integrated in a single load/unload unit 7/8. However, the holding devices 9 and 10 are located on different heights. In FIG. 7, also the linear transport device 6 is shown. It can be seen that also the carrier device 11 and the bottom side of the patterning device support are located on different heights. Thus, in order to make all exchanges possible between the load/unload unit 7/8 and the patterning device support and the carrier device 11, the load/unload unit 7/8 has to be moved between four positions in a horizontal direction, whereby also the holding devices 9, 10 have to be placed on different heights.

Thus, the load/unload unit 7/8 will take its lowest position during the exchange of a patterning device 3 between the carrier device 11 and the unload holding device 10. The second lowest position of the load/unload unit 7/8 will be taken during the exchange of a patterning device 3 between the carrier device 11 and the load holding device 9. Furthermore, the load/unload unit 7/8 will take its highest position during the exchange of a patterning device 3 between the patterning device support 2 and the load holding device 9. The second highest position of the load/unload unit 7/8 will be taken during the exchange of a patterning device 3 between the patterning device support 2 and the unload holding device 10. The height of the load/unload unit 7/8 will therefore increase when it is moved from the left side of FIG. 4 to the right.

The different heights in which the patterning device may be located are in this application all regarded to be in substantially the same plane.

Herein above a patterning device exchange device is described to exchange patterning devices on a patterning device support. Such exchange device could also be used for other movable objects, wherein the time needed for exchange is of importance, for instance critical in the time path of the lithographic apparatus. The exchange device could for instance be used for the exchange of substrates between a substrate station and the substrate support. Such embodiments are deemed to fall within the scope of the present invention.

The exchange device described in this application is also in particular suitable for the exchange of exchangeable parts of the projection system such as lens pupil filters and/or lens elements. These parts of the projection system may be exchanged between a support for this part during projection of a beam and a station in which other exchangeable parts are held which can be exchanged for obtaining different characteristics of the projection system. The exchange device of the invention may also be used as a single device in a lithographic apparatus for both the exchange of patterning devices and the exchange of exchangeable parts of the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a patterning device support configured to support a patterning device in a projection plane, the patterning device configured to impart a radiation beam with a pattern in its cross-section to form a patterned radiation beam;
    a substrate table configured to hold a substrate;
    a projection system configured to project the patterned radiation beam onto a target portion of the substrate, and
    an exchange device configured to exchange an exchangeable object with an exchangeable object support, the exchangeable object support configured to hold said exchangeable object during projection of the patterned radiation beam, said exchange device comprising
        a moveable load unit and a moveable unload unit, each of said load unit and said unload unit having a holding device to hold an exchangeable object, the holding device of said load unit and the holding device of said unload unit being configured to hold an exchangeable object in a plane substantially parallel to the plane in which the exchangeable object is held in the exchangeable object support during the projection of the patterned radiation beam, and
        a moveable carrier configured to hold an exchangeable object and to cooperate with both the holding device of the load unit and the holding device of the unload unit to transfer an exchangeable object from the moveable carrier to the holding device of the load unit and to transfer an exchangeable object from the holding device of the unload unit to the moveable carrier,
    wherein said exchangeable object support is configured to exchange an exchangeable object with each of said holding devices,
    wherein the exchangeable object support is configured to:
        (a) move to a position proximate the holding device of the load unit such that the exchangeable object is transferred from the holding device of the load unit to the exchangeable object support, and (b) move to another position that is proximate the holding device of the unload unit such that the exchangeable object is transferred from the exchangeable object support to the holding device of the unload unit, and
    wherein during transfer of the exchangeable object from the holding device of the load unit to the exchangeable object support and from the exchangeable object support to the holding device of the unload unit and during transfer of the exchangeable object from the moveable carrier to the holding device of the load unit and from the holding device of the unload unit to the moveable carrier, the holding device of the load unit and the holding device of the unload unit substantially border each other and the load unit and the unload unit substantially border each other in substantially a same plane.

2. The lithographic apparatus of claim 1, wherein said exchangeable object is the patterning device and said exchangeable object support is said patterning device support.

3. The lithographic apparatus of claim 1, wherein said exchangeable object is an exchangeable part of the projection system, said exchangeable part including a lens pupil filter or a lens element, said exchangeable object support being a support for said part of the projection system.

4. The lithographic apparatus of claim 1, wherein said exchange device is configured to exchange the patterning device in the patterning device support and to exchange an exchangeable part of said projection system in a support of said part of the projection system.

5. The lithographic apparatus of claim 1, wherein the holding device of said load unit and the holding device of said unload unit are configured to hold the exchangeable object in substantially the same plane.

6. The lithographic apparatus of claim 5, wherein said same plane substantially corresponds to the projection plane.

7. The lithographic apparatus of claim 1, wherein said exchangeable object support is configured to move from a position above said unload unit to a position above said load unit, said load unit and unload unit each being configured to move at least said holding device in a direction perpendicular to a plane through which the exchangeable object to be exchanged extends.

8. The lithographic apparatus of claim 1, wherein said exchange device is configured to move said unload unit and said load unit from a position where said unload unit is positioned under the exchangeable object support to a position where said load unit is positioned under said exchangeable object support, said load unit and unload unit each being configured to move at least said holding device in a direction perpendicular to a plane through which the exchangeable object to be exchanged extends.

9. The lithographic apparatus of claim 1, wherein said load unit and unload unit are integrated in a single load/unload unit.

10. The lithographic apparatus of claim 1, wherein said exchange device comprises a second load unit and a second unload unit.

11. The lithographic apparatus of claim 1, wherein said exchange device comprises a linear transport unit which is configured to transport one or more exchangeable objects to and from said load unit and/or unload unit.

12. The lithographic apparatus of claim 1, wherein said exchange device comprises a second load unit and a second unload unit, and wherein said exchange device comprises a transport unit which is configured to transport one or more exchangeable objects to and from at least one of said load unit and unload unit and to and from at least one of said second load unit and unload unit.

13. The lithographic apparatus of claim 12, wherein said exchange device comprises a second linear transport unit which is configured to transport one or more exchangeable objects to and from at least one of said load unit and unload unit and to and from at least one of said second load unit and unload unit.

14. The lithographic apparatus of claim 11, wherein said exchange device comprises a robot to exchange an exchangeable object between said transport unit and one or more stations.

15. The lithographic apparatus of claim 11, wherein said transport unit comprises a rotating unit configured to rotate an exchangeable object in a desired orientation.

16. The lithographic apparatus of claim 1, wherein the exchangeable object is transferred from the load unit to the exchangeable object support in a direction substantially perpendicular to the plane in which the exchangeable object is held in the exchangeable object support during the projection of the patterned radiation beam, and wherein the exchangeable object is transferred from the exchangeable object support to the unload unit in a direction substantially perpendicular to the plane in which the exchangeable object is held in the exchangeable object support during the projection of the patterned radiation beam.

17. The lithographic apparatus of claim 16, wherein the proximate position is a position above the load unit and the unload unit.

18. The lithographic apparatus of claim 1, wherein the exchangeable object support is configured to directly exchange the exchangeable object with each of the holding devices.

19. The lithographic apparatus of claim 1, wherein the moveable load unit is configured to move in the plane substantially parallel to the plane in which the exchangeable object is held in the exchangeable object support during the projection of the patterned radiation beam to exchange an exchangeable object with the moveable carrier.

20. A device manufacturing method comprising:
transferring a pattern from a patterning device onto a substrate,
exchanging an exchangeable object with an exchange device, said exchangeable object supported on a support during the transferring of said pattern in a projection phase, said exchanging including:
positioning said support at a position proximate a holding device of an unload unit that is configured to hold an exchangeable object to be unloaded from said support,
moving the unload unit in a direction substantially perpendicular to a plane through which said exchangeable object extends;
transferring said exchangeable object from said support to a holding position of said unload unit;
subsequently to said transferring of said exchangeable object, positioning said support at another position that is proximate a holding device of a load unit that is configured to hold an exchangeable object to be loaded on said support, said holding device of the load unit being positioned substantially adjacent to the holding device of the unload unit;
moving said load unit towards said support in a direction substantially perpendicular to a plane through which said support extends to exchange said exchangeable object to be loaded on said support between the load unit and the support; and
positioning the unload unit at a position proximate a moveable carrier to transfer the exchangeable object from the unload unit to the moveable carrier,
wherein during transfer of the exchangeable object from the holding device of the load unit to the support and from the support to the holding device of the unload unit and during transfer of the exchangeable object from the holding device of the unload unit to the moveable carrier, the holding device of the load unit and the holding device of the unload unit substantially border each other and the load unit and the unload unit substantially border each other in substantially a same plane.

21. The method of claim 20, wherein said support is placed above said load unit by moving said support from a position above said unload unit to a position above said load unit.

22. The method of claim 20, wherein said support is placed above said load unit by moving said load unit and unload unit from a position where said unload unit is positioned under said support to a position where said load unit is positioned under said support.

* * * * *